United States Patent [19]
Ngo et al.

[11] Patent Number: 6,159,666
[45] Date of Patent: Dec. 12, 2000

[54] ENVIRONMENTALLY FRIENDLY REMOVAL OF PHOTORESISTS USED IN WET ETCHABLE POLYIMIDE PROCESSES

[75] Inventors: David D. Ngo, San Jose; Som S. Swamy, Danville, both of Calif.

[73] Assignee: Fijitsu Limited, Japan

[21] Appl. No.: 09/227,238

[22] Filed: Jan. 8, 1999

(Under 37 CFR 1.47)

Related U.S. Application Data

[60] Provisional application No. 60/071,335, Jan. 14, 1998.
[51] Int. Cl.$^7$ .................................................. G03F 7/42
[52] U.S. Cl. ..................... 430/329; 430/317; 430/323; 430/328; 430/330
[58] Field of Search .................................. 430/323, 325, 430/326, 328, 329, 330, 317

[56] References Cited

U.S. PATENT DOCUMENTS

| | | |
|---|---|---|
| 4,078,102 | 3/1978 | Bendz et al. . |
| 4,273,857 | 6/1981 | Leberzammer et al. . |
| 4,353,978 | 10/1982 | Leberzammer et al. . |
| 4,574,031 | 3/1986 | Dorey, II et al. . |
| 4,592,787 | 6/1986 | Johnson et al. . |
| 4,775,609 | 10/1988 | McFarland et al. . |
| 4,782,007 | 11/1988 | Ferrier et al. . |
| 4,846,929 | 7/1989 | Bard et al. . |
| 4,960,846 | 10/1990 | Burgess et al. . |
| 4,975,331 | 12/1990 | Burgess et al. . |
| 5,139,607 | 8/1992 | Ward et al. . |
| 5,145,764 | 9/1992 | Bauer et al. ........................ 430/260 |
| 5,158,860 | 10/1992 | Gulla et al. . |
| 5,227,008 | 7/1993 | Klun et al. . |
| 5,262,279 | 11/1993 | Tsang et al. ........................ 430/311 |
| 5,292,445 | 3/1994 | Fjare et al. . |
| 5,308,745 | 5/1994 | Schwartzkopf et al. . |
| 5,350,487 | 9/1994 | Ameen et al. . |
| 5,381,807 | 1/1995 | Lee et al. . |
| 5,470,693 | 11/1995 | Sachdev et al. ........................ 430/315 |

OTHER PUBLICATIONS

AZ 4000 Series Photoresists For Thick Film Applications.
Pyralin SP Polyimide Coatings—P1–111 Processing Guidelines—Dupont Electronics.

*Primary Examiner*—John A. McPherson
*Attorney, Agent, or Firm*—Coudert Brothers

[57] ABSTRACT

Normally, a positive photoresist is developed with an alkaline aqueous solution to form patterns, and is subsequently stripped with an organic solvent after the photoresist has served its function. Such strippers are relatively toxic and damaging to the environment, and cannot be handled by standard (community) waste-water treatment facilities. These strippers cannot be easily neutralized, and must be disposed of in a highly specialized and relatively expensive manner. The present invention provides a method of treating positive and negative photoresists during their usage as photo masks such that the photoresists may be removed by less toxic chemicals which can be readily neutralized and handled by conventional waste water treatment facilities.

37 Claims, 1 Drawing Sheet

ENVIRONMENTALLY FRIENDLY REMOVAL OF PHOTORESISTS USED IN WET ETCHABLE POLYIMIDE PROCESSES

CROSS REFERENCE TO RELATED APPLICATIONS

This application claims the benefit of U.S. Provisional Application 60/071,335 filed Jan. 14, 1998.

FIELD OF THE INVENTION

The present invention relates to the patterning of wet-etchable polymeric layers using photoresists, and more particularly to the removal of photoresists used in such processes without using toxic strippers.

BACKGROUND OF THE INVENTION

Positive and negative photoresists are used in the semiconductor fabrication art to pattern the material layers that are formed on silicon substrates to construct integrated circuits. In the conventional practice, a material layer for the integrated circuits is formed over the substrate, or is formed over other material layers that have been previously formed over the substrate. Next, a photoresist layer, which may be a positive type, a negative type, or an image-reversal type, is formed over the material layer by spin coating, followed by soft-baking at around 90° C. to 110° C. Thereafter the photoresist layer is exposed to ultraviolet light (actinic radiation) through a pattern mask, which replicates a pattern on the photoresist which may be removed by a developer solution. For positive resists, the replicated pattern is substantially identical to that of the mask, and is a positive image. For negative photoresists, the replicated pattern is the negative, or reverse of the mask pattern. The photoresist is then exposed to the developer to remove the replicated pattern, thereby leaving portions of the underlying material layer exposed. Developers for positive photoresist usually comprise a moderately basic solution (aqueous alkaline solution) at a pH of between 10 and 12. Developers for negative photoresist usually comprise an organic solvent. Depending upon its composition, the photoresist layer is usually then baked at a temperature between 100° C. and 150° C. (i.e., post-baked) to improve its stability. After the photoresist layer has been developed and optionally post-baked, the substrate is dipped in an etchant solution which attacks the exposed portions of the underlying material layer but not the photoresist. After the material layer has been sufficiently etched, the substrate is rinsed, and the photoresist layer is removed by exposure to a stripper solution, which typically comprises a relatively toxic organic solvent and which must be disposed of in a highly specialized and expensive manner. A typical stripper comprises n-butyl acetate, which is toxic and flammable.

The present invention seeks to modify the use of the photoresist layer in the above-described conventional patterning process so that the photoresist may be stripped by using chemical solutions which are non-toxic or which can be neutralized to be non-toxic, thereby making the above-described patterning process more environmentally friendly.

SUMMARY OF THE INVENTION

Prior to practicing the present invention, a photoresist is formed over a pre-existing polymeric layer, which may comprise, for example, a wet-etchable polyimide precursor (e.g., polyamic acid). The photoresist is then patterned (UV exposed and developed), and the underlying polymeric layer is wet-etched with a suitable etchant. The etchant for the polymeric layer may be the developer of the photoresist layer (e.g., an aqueous alkaline solution), and the etching of the polymeric layer may be done at the same time as the development of the photoresist layer.

As an inventive part of the present invention, the polymeric layer is at least partially imidized before the positive photoresist is removed so that the polymeric layer cannot be readily dissolved by an alkaline-aqueous based solution. The imidization process is done in such a manner that the solubility of the photoresist layer in an alkaline-aqueous based solution is not substantially degraded. Prior to, during, or after the imidization step, the photoresist is exposed to actinic radiation (e.g., ultraviolet light, heat) to render it soluble in an alkaline aqueous solution. The exposure step, which is different from the initial exposure step used to pattern the photoresist, is preferably done before and/or simultaneously with the imidization step because the exposure step generates an organic acid within the photoresist layer which acts to catalyze the imidization reaction in the adjacent polymeric layer. Thereafter, the photoresist layer is removed by an exposure to an alkaline aqueous developer solution, which does not destroy the etched patterns of the polymeric layer due to the prior imidization step. The used developer solution may then be neutralized with an acid or diluted with relatively small quantities of water so as to be non-toxic.

In developing their inventions, the inventors have recognized that many aqueous alkaline etchants and developers are relatively non-toxic, usually consisting primarily of water and potassium hydroxide (KOH), and can be readily neutralized with an appropriate amount of hydrochloric acid (HCL) to produce water and a benign potassium salt (KCL).

The above described imidization step may be performed in a number of ways. As one example, the photoresist and polymeric layers may be heat treated (e.g., baked) at a judiciously chosen temperature which partially imidizes the polymeric layer without affecting the solubility properties of the photoresist layer. As another way, both layers may be exposed to microwave radiation, which preferentially heats the polymeric material with respect to the photoresist material. Also exposing the polymeric layer to an acid will imidize the outer exposed skin of the polymeric layer. In this regard, exposing the photoresist to actinic radiation may be used to form acidic decomposition products in the photoresist layer which can then be used to imidize the outer skin of the polymeric layer over the time period of several hours. Any side walls of the patterned polymeric layer which are not covered by the photoresist layer may be exposed to an acidic aqueous solution.

The present invention thereby provides a method of treating photoresist layers during their usage as photo masks such that the photoresists may be removed by less toxic chemicals which can be readily neutralized and handled by conventional waste water treatment facilities.

Accordingly, it is an object of the present invention to enable conventional patterning processes to be practiced with less toxic chemicals, thereby making these processes more environmentally friendly.

It is another object of the present invention to enable the processing of polymeric layers more environmentally friendly and safer for processing technicians to practice.

These and other objects of the present invention will become apparent to those skilled in the art from the following detailed description of the invention, the accompanying drawings, and the appended claims.

DETAILED DESCRIPTION OF THE INVENTION

FIG. I shows a partial cross-sectional view of a substrate 5 having a polymeric layer 12 disposed thereon, which in turn has a positive photoresist 14 disposed thereon. Polymeric layer 12 may have a thickness of approximately 8 $\mu$m of PI-1111® PYRALIN®SP material manufactured by the DU PONT Corporation. Before forming photoresist layer 14 over polymeric layer 12, layer 12 is soft-baked on a hot plate or in an oven at 120° C. (temperature as measured at the wafer) for 2 minutes. The soft-baking aids in removing the solvent carrier used to fluidize the long-chain molecules of the polymeric material. Thereafter, photoresist 14 is coated over layer 12 at a thickness of 3 $\mu$m. Photoresist Layer 14 may comprise the photoresist AZ-4620® or AZP-4620®, both of which are manufactured by the Hoechst Corporation. Thereafter, photoresist layer 14 is soft-baked on a hot plate or in an oven at 110° C. (temperature as measured at the wafer) for one minute. The soft-baking aids in removing the solvent carrier used to fluidize the long-chain molecules of the photoresist material.

Figure 1:
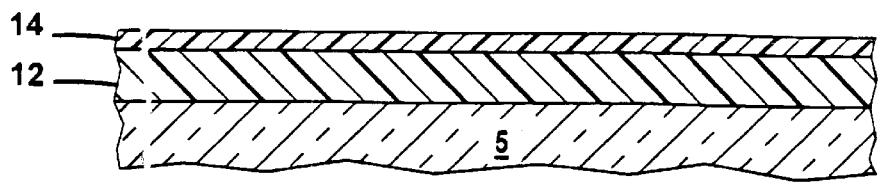
FIG. 1 is a partial cross section of a wafer having a polymeric layer and a positive photoresist layer thereon suitable for use by the present invention.
Figure 2:
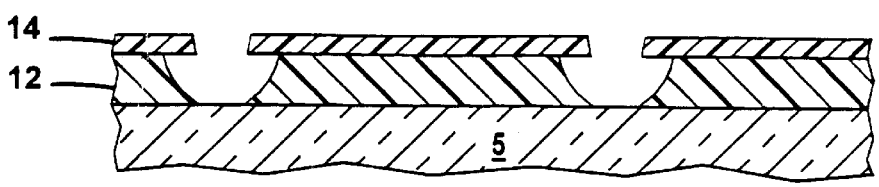
FIG. 2 is a partial cross section of a wafer having a polymeric layer and a patterned positive photoresist layer thereon suitable for use by the present invention.

Photoresist layer 14 may then be pattern exposed to actinic radiation, such as ultraviolet (UV) light, and developed by an appropriate developer, such as the AZ Developer® solution, the AZ4000K® developer solution, or most of the other commercially available positive photoresist developer solutions. These developers comprise aqueous alkaline solutions, typically using potassium hydroxide (KOH) or sodium hydroxide (NaOH). Between the exposure and developing steps, an optional post-exposure bake step may be performed according to the teachings of the prior art. Once photoresist layer 14 is developed, the exposed portions of polymeric layer 12 may be etched. The etching may be accomplished by using any of the above-described developer solutions, and may be performed simultaneously with the development step or as a separate, subsequent step. The result of developing layer 14 and of etching layer 12 is shown in FIG. 2.

Before describing the next processing steps according to the present invention, the material properties of layers 12 and 14 are described.

Material Properties of Polyamic Acid

The PI-1111 material comprises a fluorinated polyamic acid. Polyamic acids generally comprises chains of repeated organic units. The chemical formula for one repeated unit of a basic and exemplary polyamic acid is provided below:

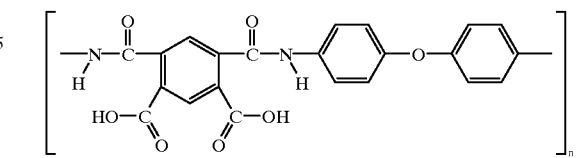

Each organic unit generally has a number of benzene rings ($C_6H_6$) linked together in a serial manner by intermediate molecules, such as singlet oxygen (—O—) and carbon-nitrogen pairs (—C—N—). In the carbon-nitrogen pairs, an oxygen atom may be double bonded with the carbon atom, and a hydrogen atom may be single bonded to the nitrogen atom. In a fluorinated polyamic acid, one or more fluorine (F) atoms may be added to the intermediate molecules. Fluorinating the polyamic acid helps to lower the dielectric constant of the material, which is an important electrical characteristic for electrical signal propagation in interconnect modules and the like. The fluorination of the polyamic acid is not necessary to practice the present invention, which may be equally applied to non-fluorinated polymers.

One or more carboxyl groups (COOH) are bonded to various carbon atoms in the benzene rings of the polyamic acid. Carboxyl groups, which are found in many organic acids, enable the hydrogen atom in the group to be readily disassociated in water to provide acidic action. Typically, in each repeated unit of a polyamic acid, there are two carboxyl groups bonded to two respective carbon atoms of a benzene ring. The carbon atom in the carboxyl group has a single bond to the respective carbon atom in the benzene ring, a double bond to one of the oxygen atoms, and a single bond to an oxygen atom of an OH group. The polyamic acid, by itself, is a solid which is not readily dissolvable in acidic aqueous solutions. However, in basic solutions, the acid groups react with the alkaline reagents of such solutions, which enables the polymeric acid to more readily dissolve.

One common feature of polyamic acids is the location of a carboxyl group (COOH) and a carbon-nitrogen group (—C—N—) in close proximity to one another, often on adjacent positions of a carbon ring as shown above. When sufficient energy is imparted to the polyamic acid, the OH group of a carboxyl group (COOH) can react with the hydrogen atom of an adjacent carbon-nitrogen pair (—C—N—) to form a water molecule ($H_2O$). In this process, the carbon atom in the decomposed carboxyl group forms a single bond with the nitrogen atom from the carbon-nitrogen pair. The resulting molecular unit is called a polyimide unit and has the following form:

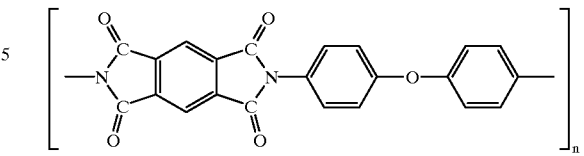

Prior to this reaction, the carboxyl group and the carbon-nitrogen pair are attached to a common benzene ring in close proximity to one another, being linked to each other through the following chain of atoms: H—N—C—c—c—C—OH, where a lower case letter "c" denotes a carbon of a benzene ring. When the hydrogen (H) at the left end of the chain reacts with the OH group at the right end, the nitrogen at the left end and the carbon at the right end bond together and form the following cyclic ring of five atoms:

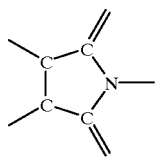

which is known as an "imide ring." Accordingly, the above process is often called "imidization", or "imide-ring cyclization," and is well known in the art. The imidization reaction destroys the acidic action of the carboxyl group, which reduces the solubility of the polyamic acid.

Of course, the carboxyl group (COOH) and the carbon-nitrogen pair (—C—N—) which react together may not be attached to common benzene ring, but may be attached to separate benzene rings on different polymer chains. In this case, a cyclic ring is not formed, but two polyamic acid chains are cross-linked together. Nonetheless, the acidic action of the carboxyl group is destroyed, and the solubility of the polyamic acid is reduced. Because the results are the same as in the previous case, the reaction will be also referred to as "imidization" for the purposes of the claims of the present invention. In both of the above reactions, the destruction of the acidic action of the carboxyl group will be referred to as the decomposition of the carboxyl group (COOH). The inventors have found that the reactions for carboxyl group decomposition and imidization may be initiated in a number of ways, such as:

1. Exposing the polyamic acid layer to another acid will imidize the outer exposed skin of the polymeric layer; in this case the acid acts as a catalyst which lowers the activation energy for the reactions. Exposure to moderate temperatures may be required.
2. Heating the polyamic acid layer to a temperature, typically around 120° C. and above, which causes the above described reactions to occur at a reasonably fast reaction rate; the reaction rate increases with increasing temperature, generally doubling with each 10° C. increase. A reasonable reaction rate enables 10% imidization within 30 minutes. By treating the layer with acid, as described above, the catalytic action of the acid lowers the activation energies for the reactions and enables the reactions to proceed at reasonable rates at temperatures below 120° C.
3. Exposing the polymeric acid to microwave radiation, which is readily absorbed by the O—H bond in the carboxyl (COOH) group and the N—H bond in the carbon-nitrogen pair (-C-N-) due to the highly polar nature of these bonds.
4. Exposing the polymeric acid to infrared radiation.
5. Exposing the polymeric acid to ultrasonic waves may be used alone, or as a catalyst.

The above methods of initiating the reactions may be used alone or in combination. Once the polyamic acid becomes imidized to a substantial degree (usually more than 50% of carboxyl groups being decomposed and re-bonded to carbon-nitrogen pairs), it is referred to as polyimide.

Material Properties of Diazoquinone-Novolak (DQN) Positive Photoresist

A typical positive photoresist comprises a resin, a photo-sensitizer chemical, and a solvent base. The solvent base dissolves the resin and photo-sensitizer chemical, and is evaporated after the wafer has been coated to form a layer thereon. The resin's polymer chains may be insoluble in alkaline-aqueous solutions, or may be soluble but their solubility is inhibited by the photo-sensitizer chemical. Upon exposure to actinic radiation, the molecules of the photo-sensitizer decompose into acidic products. The decomposition of the photo-sensitizer destroys its ability to inhibit the solubility of the resin, and the resulting acidic products readily dissolve in the presence of an alkaline-aqueous solution, an action which usually promotes the dissolving of the polymer chains of the resin. The exposed portions of the positive-type photoresist then become soluble in an alkaline aqueous solution.

In diazoquinone-novolak (DQN) based positive photoresists, the resin comprises a phenolic-formaldehyde (novolak) resin, and the photo-sensitizer chemical comprises diazoquinone, in the amount of 5% to 25% by weight of the resin. A trace amount of water is added to the mixture of the photo-sensitizer and the resin. A polymer chain in the novolak resin typically comprises a plurality of meta-cresol ($CH_3$—$C_6H_6$—OH) groups which are serially linked to one another by intervening methylene($CH_2$) groups (e.g., meta-cresol—$CH_2$—meta-cresol—$CH_2$—etc.). The meta-cresol groups have polar ends (—OH) which form weak bonds with water, thereby enabling the resin chain to be dissolved by alkaline aqueous solutions. The diazoquinone molecules also have polar ends (—C=O) which are complimentary to those of the meta-cresol groups, and which form weak bonds with corresponding polar ends of the meta-cresol groups. The weak bonding of the diazoquinone molecules to the polar ends in the novolak resin blocks water molecules from attaching to the novolak resin and dissolving it. In this manner, the diazoquinone inhibits the dissolution of the novolak resin in an alkaline aqueous solution (at least up to a concentration of 0.1 to 0.3 N).

Upon exposure to ultraviolet light (actinic radiation), or to temperatures above 100° C., the diazoquinone reacts with trace amounts of water and is converted to a soluble indene carboxylic acid (R—$C_6H_6$—$C_3$COOH). In this reaction, the complimentary polar end (—C=O) of the diazoquinone molecule is destroyed, and is replaced with carboxyl group (—COOH), which is not complimentary to the polar end of a meta-cresol group (—OH). The carboxyl group does not form a weak bond with the meta-cresol group, and water molecules are thereby able to form weak bonds to the polar ends of the meta-cresol groups and dissolve the resin. The indene carboxylic acid is also dissolved by water, and in doing so slightly enhances the dissolution of the novolak resin. The rate of dissolution for both the indene carboxylic acid and the novolak resin increases as the pH of the water increases (i.e., as the water becomes increasing alkaline).

If an exposed but undeveloped DQN resist is heated to above about 160° C. for more than about 10 minutes, a chemical reaction occurs to a sufficient degree to render the novolak resin insoluble in alkaline aqueous solutions. In this reaction, the carboxyl group of the indene carboxylic acid is decarboxylated (i.e., destroyed) to produce an insoluble indene compound as indicated in TABLE I below.

TABLE 1

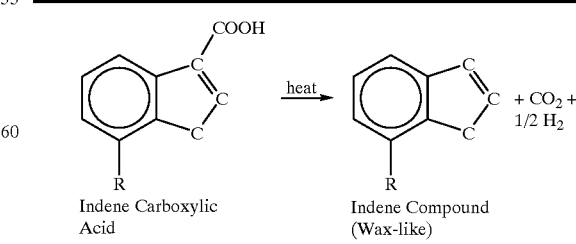

Indene Carboxylic Acid → Indene Compound (Wax-like) + $CO_2$ + $1/2\ H_2$

The insoluble indene compound is a wax-like substance and inhibits water from attaching to the polar sites of the novolak resin.

Exemplary Embodiments According to the Present Invention

Figure 3:
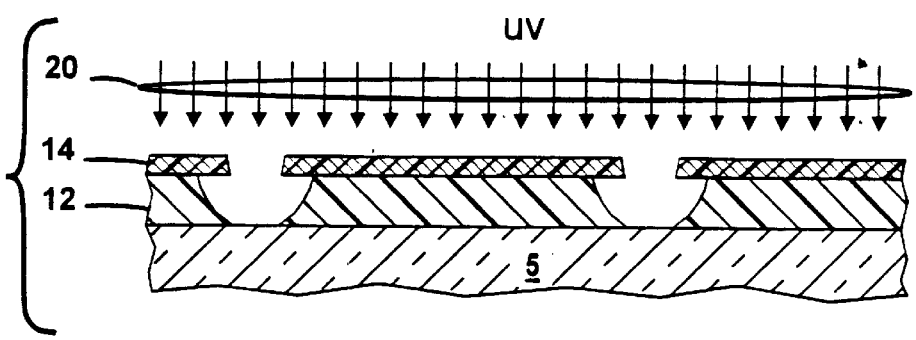
FIG. 3 is a partial cross section of a wafer having a polymeric layer and a patterned positive photoresist layer thereon undergoing an exposure to actinic radiation according to one exemplary embodiment of the present invention.

Having described the properties of exemplary materials for polymeric layer 12 and photoresist layer 14, the steps of an exemplary embodiment according to the present invention for removing photoresist layer 14 in an environmentally friendly manner are described next. At the starting point of the removal process, as shown in FIG. 2, the remaining portions of polymeric layer 12 comprises polyamic acid which has not yet been imidized to any substantial degree, and the remaining portion of photoresist layer 14 comprises diazoquinone, novolak resin, and trace amounts of water. As the first step of removing photoresist layer 14, the entire layer is exposed to actinic radiation to convert the diazoquinone photo-sensitizer molecules to indene carboxylic acid molecules. This step is shown in FIG. 3, with the actinic radiation being shown at 20. The actinic radiation may comprise broad band UV radiation at an intensity of 42 mW/cm$^2$ for 30 seconds, which provides a total dose of 1,260 mJ/cm$^2$. A blank flood exposure may be used.

Figure 4:
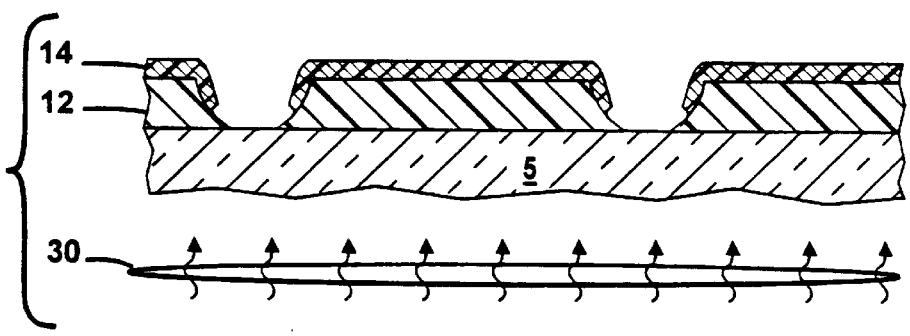
FIG. 4 is a partial cross section of a wafer having a polymeric layer and a patterned positive photoresist layer thereon undergoing a step of imidizing the polymeric layer according to one exemplary embodiment of the present invention.

After the exposure to actinic radiation, the photoresist can now be removed. However, exposing layer 14 to the alkaline aqueous developer would further etch the polyamic acid of layer 12, which is highly undesirable. To prevent the etching of layer 12, the next step of this exemplary embodiment is to heat both layer 12 and 14 to a an elevated temperature which at least partially imidizes layer 12, but which does not decarboxylate (i.e., does not destroy the carboxyl groups) of the indene carboxylic acid in layer 14 to a degree which would render the novolak resin in layer 14 insoluble in the alkaline developer. (As used herein, elevated temperature means a temperature which is above standard room temperature conditions, which is 25° C.) The heating step may be accomplished by exposing the layers to a temperature above 120° C. (which initiates imidization in polymer layer 12), but below 160° C. (which would decarboxylate the carboxyl groups in photoresist layer 14). Preferably, a temperature of 155° C. is not exceeded. As one example, which the inventors currently find preferable, the wafer with layers 12 and 14 is baked over a hot plate at a temperature of 150° C. (actual wafer temperature) for 2.5 minutes. This is shown in FIG. 4, where the conduction of heat is indicated at 30. As other examples, the wafer may be baked at 140° C. for 5 minutes, or 155° C. for 2 minutes. After the heating step, polymeric layer 12 is partially imidized to the point that it is substantially insoluble in an alkaline aqueous solution. The indene carboxylic acid in the adjacent photoresist layer 14 acts as a catalyst during the heating process to more fully imidize the outer surface of layer 12, which underlie layer 14. At least 20%, and more preferably at least 40%, of the imidization sites at the outer surface of the polymeric layer 12 have been imidized by this step, thereby at least forming a substantially insoluble skin, or shell, for layer 12. As an optional step to provide additional imidization of the skin of layer 12, the exposed photoresist layer 14, which has the indene carboxylic acid, may be left on top of layer 12 for one or more hours before and/or after the heating step. If photoresist layer 14 has a high concentration of carboxylic acid, it may be possible to achieve sufficient imidization of the skin of layer 12 without a heating step by allowing the exposed photoresist layer 14 sit on top of layer 12 for several hours to a day.

The novolak resin begins to melt at about 135° C., which increases the diffusion rate of the indene acid. In this process, a portion of the side walls of layer 12 may be covered by the melting photoresist layer, and therefore may have the benefit of being catalyzed by the indene acid. Those sidewall portions not covered by melting photoresist material would not be catalyzed by the indene acid. However, the 2.5minute exposure and the relatively large temperature processing window (120° C.–155° C.) provide sufficient imidization for the sidewalls. If desired, the sidewalls may be pre-treated with an organic acid before the heating step in order to provide the catalytic action. This pre-treatment action may be useful in cases where a particular set of formulations for layers 12 and 14 provides for a relatively narrow temperature processing window.

While the above times and temperatures have worked well for the particular materials used, combinations of different materials will likely have optimal processing times and temperatures which are different than described above. Nonetheless, in such cases, one of ordinary skill in the art may use the conventional technique of processing a plurality of substrates with different temperatures and times to find optimal parameter ranges.

In addition to exposure to heat and exposure to a catalytic acid, the polyamic acid may be imidized by exposure to other energy forms, such as microwaves, ultrasonic waves, and infrared radiation. In general, these forms of energy would be absorbed at different rates by the particular polymeric and photoresist materials used for layers 12 and 14, respectively. Thus, a particular energy source, or a combination of particular energy sources, may be selected so as to impart more energy to layer 12 than to layer 14 during the imidization step. Additionally, catalysts may be added to lower the activation energy required for the imidization step.

Combining these energy sources may be useful when the energy input of one method, when used alone, would initiate chemical reactions in a particular photoresist material which would render that photoresist material insoluble in an aqueous alkaline solution. In such a case, two or more of the above methods may work synergistically together to initiate imidization in the polyamic acid, while not being sufficient, either alone or in combination, to initiate decarboxylation in the photoresist layer. As one example, combining the heating and microwave sources can selectively impart more energy to the imidization reactions in the polyamic layer than to the decarboxylation reaction in the photoresist layer. This particular synergism works because the chemical bonds that are broken during the decarboxylation reaction in the photoresist are generally less polar than the chemical bonds broken during the imidization reaction in the polyamic acid, and therefore absorb less of the microwave radiation.

As the next step in the removal process, a photoresist layer is exposed to an alkaline aqueous solution, such as any of the above described developers used to initially pattern layer 14. The following spin-spray development process may be used:

(a) spray water for 5 seconds while the substrate is spun at 600 RPM.

(b) spray AZ Developer® for 5 seconds while the substrate is spun at 600 RPM.

(c) spray AZ Developer® for 115 seconds while the substrate is spun at 150 RPM.

(d) spray water for 25 seconds while the substrate is spun at 600 RPM.

(e) spin dry water for 20 seconds at 3,000 RPM.

Figure 5:
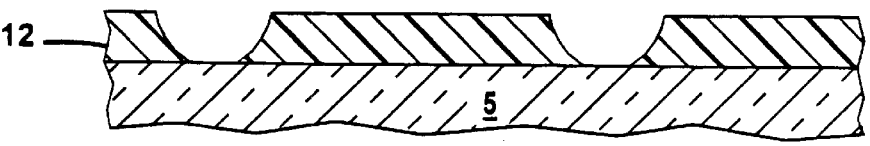
FIG. 5 is a partial cross section of a wafer having a polymeric layer with the patterned positive photoresist layer removed according to one exemplary embodiment of the present invention.

RPM represents the revolutions per minute of the substrate holder. The efflux from the spin development step comprises a relatively benign combination of water, novolak salt, and a hydroxide, which is usually potassium or sodium hydroxide. The latter may be neutralized by the addition of hydrochloric acid (HCL) to lower the pH of the efflux to a neutral value of between 6 and 8, and preferably close to 7. The resulting structure is shown in FIG. 5. Layer 12 may then be heated again to complete the imidization process.

The above development step uses the standard development time of 2 minutes. If a significant portion of the indene acid is converted to the wax-like indene compound, the development time can be extended to compensate for the reduction in solubility caused by the indene compound. Preferably, the above imidization step does not alter the photoresist layer to a degree where it cannot be dissolved by an aqueous-alkaline based developer within a fifteen-minute exposure to the developer or to an extra-strong developer (pH of 13).

In the above example, the second step of exposing layer 14 to actinic radiation occurs before the imidization step, and provides the benefit of forming a catalytic acid (indene carboxylic acid) at the outer skin of layer 12 prior to the imidization step. However, it may be appreciated that the second exposure step may occur after the imidization of polymeric layer 12. In that case, a heating step to imidize the polymeric layer would cause some of the diazoquinone in the photoresist to be converted to indene carboxylic acid, which catalyzes the imidization reaction. Approximately 50% of the diazoquinone is converted to the indene acid when baked at 100° C. for 30 minutes. The rate of conversion to the indene acid has an activation energy of approximately 33 kcal/mole, and the corresponding reaction rate approximately triples for each 10° C. increase in temperature. For example, approximately 50% of the diazoquinone may be converted in a little over one minute when baked at 130° C. After the imidization step, the remaining diazoquinone may be converted to the indene acid by exposure to actinic radiation after the imidization step. As yet another embodiment, the heating step and the second exposure step may be performed simultaneously.

In light of the fact that heat may be used to convert the diazoquinone to the indene acid, other embodiments of the present invention replace the second exposure step with a heat treatment. For example, layers 12 and 14 may be initially baked at 120° C. for approximately 7 minutes to convert nearly 75% of the diazoquinone to the indene acid in the photoresist, and then baked at 150° C. for two minutes to imidize the polyamic acid. However, baking the photoresist for this longer period of time enables two reactions within the photoresist to occur which tend to reduce the solubility of the photoresist. The first reaction is the oxidation of the novolak resin at the skin of the photoresist, which may be inhibited by performing the heating steps in the absence of oxygen (e.g., baking in an inert atmosphere). The second reaction is the esterification of the novolak resin by the diazoquinone, which is normally inhibited by the trace amounts of water in the photoresist. This second reaction may be inhibited by heating the layers in a steam environment and/or including additional water in the resist. Both of these reactions may be collectively inhibited by heating in an inert steam environment. Because of the additional time and steps required with this embodiment, it currently is not as preferred as the previously described embodiments. Nonetheless, this embodiment may be advantageous in situations where the use of the second actinic radiation exposure step is not desirable.

While the present invention has been particularly described with respect to the illustrated embodiment, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of processing a photoresist layer which is disposed upon a polymeric layer, said method comprising the steps of:
    (a) at least partially imidizing the polymeric layer while not altering the photoresist layer to a degree where it cannot be dissolved by an aqueous-alkaline based developer; and
    (b) thereafter exposing the photoresist layer to an aqueous alkaline solution to remove the photoresist layer without substantially removing the polymeric layer.

2. The method of claim 1 wherein the step (a) comprises the steps of exposing the photoresist layer to actinic radiation and heating the polymeric layer to an elevated temperature.

3. The method of claim 2 wherein the elevated temperature is above 120° C.

4. The method of claim 2 wherein the elevated temperature is between 120° C. and 155° C.

5. The method of claim 2 wherein the polymeric layer is heated to a temperature of between 140° C. and 155° C. for a period of time between 2 and 5 minutes.

6. The method of claim 2 wherein the step of exposing the photoresist to actinic radiation is performed before the step of heating the polymeric layer.

7. The method of claim 1 wherein the photoresist layer has been patterned prior to step (a), and wherein step (a) comprises the step of exposing the photoresist and polymeric layers to an acidic aqueous solution.

8. The method of claim 1 wherein step (a) comprises exposing the photoresist layer to actinic radiation to form an acid therein, and thereafter waiting at least an hour before developing the photoresist layer.

9. The method of claim 1 wherein the photoresist layer is not altered by the imidization step to a degree where it cannot be dissolved by an aqueous-alkaline based developer having a pH of 13 within fifteen minutes.

10. The method of claim 1 further comprising the step of:
    (c) mixing an acid with said aqueous alkaline solution to lower the pH of said solution, said mixing step occurring after the photoresist layer has been exposed to said aqueous alkaline solution in step (b).

11. A method of processing a photoresist layer which is disposed upon a polymeric layer, said photoresist layer being previously patterned, said method comprising the steps of:
    (a) exposing the patterned photoresist layer to actinic radiation;
    (b) at least partially imidizing the polymeric layer; and
    (c) exposing the photoresist layer to an aqueous alkaline solution to remove the photoresist layer without substantially removing the polymeric layer, said step
    (c) occurring after steps (a) and (b) have been performed.

12. The method of claim 11 further comprising the step of:
    (d) further imidizing the polymeric layer, said step (d) occurring after step (c) has been performed.

13. The method of claim 11 wherein said step (b) precedes said step (a).

14. The method of claim 11 wherein said step (a) is performed before step (b).

15. The method of claim 11 where steps (a) and (b) are performed simultaneously.

16. The method of claim 11 wherein step (b) comprises the step of heating the photoresist and polymeric layers to a temperature which is above 120° C.

17. The method of claim 16 where step (b) further comprises at least one of the steps of (1) exposing the polymeric layer to an acid, (2) exposing the polymeric layer to microwave radiation, (3) exposing the polymeric layer to infrared radiation, and (4) exposing the polymeric layer to ultrasound.

18. The method of claim 11 wherein the step (b) comprises the step of exposing the polymeric layer to an elevated temperature which is above 120° C.

19. The method of claim 11 wherein the step (b) comprises the step of exposing the polymeric layer to an elevated temperature which is between 120° C. and 155° C.

20. The method of claim 11 wherein the step (b) comprises the step of exposing the polymeric layer to an elevated temperature which is between 140° C. and 155° C. for a period of time between 2 and 5 minutes.

21. A method of processing a photoresist layer which is disposed upon a polymeric layer, said method comprising the steps of:
   (a) exposing the photoresist layer to actinic radiation such that an organic acid product is formed therein, each molecule of said acid product comprising at least one carboxyl group (COOH);
   (b) thereafter heating the photoresist and polymeric layers to an elevated temperature for a period of time, said elevated temperature over said time period being insufficient to destroy more than 50% of carboxyl groups in said photoresist; and
   (c) thereafter exposing the photoresist layer to an aqueous alkaline solution to remove the photoresist layer from the polymeric layer.

22. The method of claim 21 wherein the elevated temperature is above 120° C.

23. The method of claim 21 wherein the elevated temperature is between 120° C and 155° C.

24. The method of claim 21 wherein said step (b) comprises the step of heated the polymeric layer to a temperature of between 140° C. and 155° C. for a period of time between 2 and 5 minutes.

25. A method of processing a photoresist layer comprising photo-sensitizer molecules which is disposed upon a polymeric layer, said method comprising the steps of:
   (a) converting at least 50% of the photo-sensitizer molecules in the photoresist layer to organic acid molecules, each molecule of said acid product comprising at least one carboxyl group (COOH);
   (b) at least partially imidizing the polymeric layer while not destroying more than 50% of carboxyl groups in said photoresist; and
   (c) thereafter exposing the photoresist layer to an aqueous alkaline solution to remove the photoresist layer without substantially removing the polymeric layer.

26. The method of claim 25 where step (b) comprises at least one of the steps of (1) exposing the polymeric layer to an elevated temperature, (2) exposing the polymeric layer to microwave radiation, (3) exposing the polymeric layer to infrared radiation, and (4) exposing the polymeric layer to ultrasound.

27. The method of claim 25 wherein the step (b) comprises the step of exposing the polymeric layer to an elevated temperature which is above 120° C.

28. The method of claim 25 wherein the step (b) comprises the step of exposing the polymeric layer to an elevated temperature which is between 120° C. and 155° C.

29. The method of claim 25 wherein the step (b) comprises the step of exposing the polymeric layer to an elevated temperature which is between 140° C. and 155° C. for a period of time between 2 and 5 minutes.

30. A method of processing a photoresist layer which is disposed upon a polymeric layer, said method comprising the steps of:
   (a) exposing the photoresist layer to a selected pattern of actinic radiation;
   (b) developing the exposed photoresist layer;
   (c) heating the polymeric layer and the photoresist layer to at least partially imidize the polymeric layer and to increase the solubility of the photoresist layer in an aqueous-alkaline based developer having a pH of less than 13; and
   (d) thereafter exposing the photoresist layer to an aqueous alkaline solution to remove the photoresist layer from the polymeric layer.

31. The method of claim 30 wherein said step (c) comprises the step of heating the layers to a temperature of at least 120° C.

32. The method of claim 30 wherein said step (c) comprises the step of heating the layers to a temperature of between 120° C. and 155° C.

33. The method of claim 30 wherein said step (c) comprises the step of heating the layers to a temperature of between 140° C. and 155° C. for a period of time between 2 and 5 minutes.

34. A method of processing a photoresist layer which is disposed upon a polymeric layer, said method comprising the steps of:
   (a) exposing the photoresist layer to a selected pattern of actinic radiation;
   (b) developing the exposed photoresist layer to form a pattern therein;
   (c) etching the portions of the polymeric layer exposed by the patterned photoresist layer;
   (d) exposing the developed photoresist layer to actinic radiation;
   (e) heating the developed photoresist and polymeric layers to a temperature between 140° C. and 155° C. for a period of time between 2 and 5 minutes; and
   (f) exposing the photoresist layer to an aqueous alkaline solution to remove the photoresist layer from the polymeric layer, said step (f) being performed after step (e) has been performed.

35. The method of claim 34 wherein said step (d) precedes said step (e) is performed.

36. The method of claim 34 wherein said step (e) is performed before step (d) is performed.

37. The method of claim 34 where steps (d) and (e) are performed simultaneously.

* * * * *